United States Patent [19]

Sakai et al.

[11] Patent Number: 5,347,150

[45] Date of Patent: Sep. 13, 1994

[54] SEMICONDUCTOR INPUT/OUTPUT CIRCUITS OPERATING AT DIFFERENT POWER SUPPLY VOLTAGES

[75] Inventors: Izumi Sakai; Yukinori Uchino, both of Yokohama; Yasunori Tanaka, Yokosuka; Toshiaki Mori, Yokohama, all of Japan

[73] Assignee: Kabushiki Kaisha Toshiba, Kawasaki, Japan

[21] Appl. No.: 39,666

[22] Filed: Mar. 30, 1993

[30] Foreign Application Priority Data

Mar. 31, 1992 [JP] Japan ................................. 4-105957
Dec. 14, 1992 [JP] Japan ................................. 4-353626

[51] Int. Cl.$^5$ ................................................ H01L 27/10
[52] U.S. Cl. .................................... 259/203; 257/207; 257/357
[58] Field of Search ............... 257/203, 304, 206, 207, 257/357

[56] References Cited

U.S. PATENT DOCUMENTS 3,916,430  10/1975  Heuner et al. ....................... 257/369
4,853,757  8/1989  Kuramitsu et al. ................. 257/204
4,992,845  2/1991  Arakawa et al. .................... 257/206

FOREIGN PATENT DOCUMENTS 61-264747  11/1986  Japan ................................... 257/207
62-128544  6/1987  Japan ................................... 257/203
2062063  1/1990  Japan .
2-170461  7/1990  Japan ................................... 257/203

OTHER PUBLICATIONS

JDEC Standard No. 8-1, "Interface Standard for Low Voltage TTL-Compatible (LVTTL) VLSI Digital Circuits," Dec. 1984.

Primary Examiner—Robert Limanek
Attorney, Agent, or Firm—Finnegan, Henderson, Farabow, Garrett & Dunner

[57] ABSTRACT

In an integrated circuit device using a plurality of different power supply voltages, the application of an input voltage exceeding the power supply voltages to an input/output circuit is prevented. When a p-type substrate is used, a plurality n-wells are formed to surround an integrated circuit region on a central portion of the substrate. When an n-type substrate is used, a plurality of p-wells are formed in the same manner. A predetermined power supply voltage is applied to each well to select transistors of the input/output buffer in accordance with the voltage level of an external voltage.

21 Claims, 11 Drawing Sheets

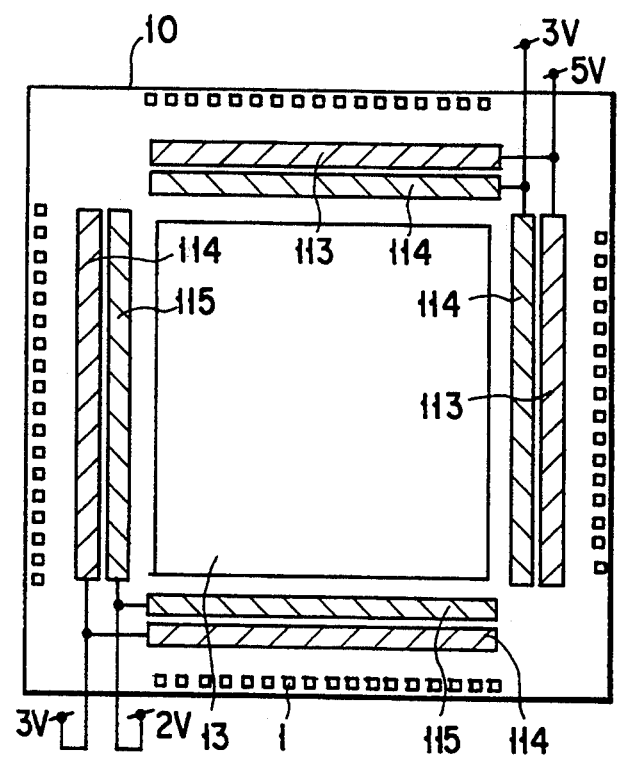
F I G. 13
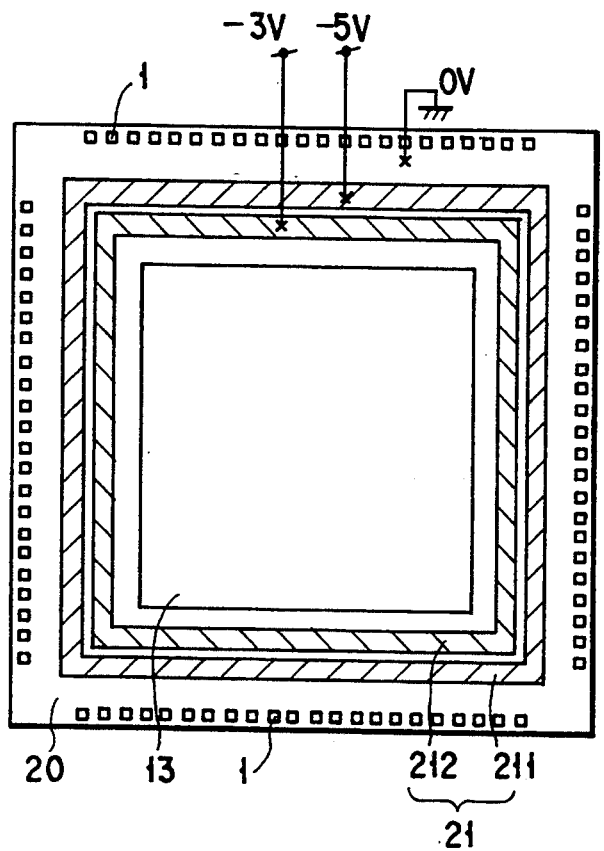
F I G. 14

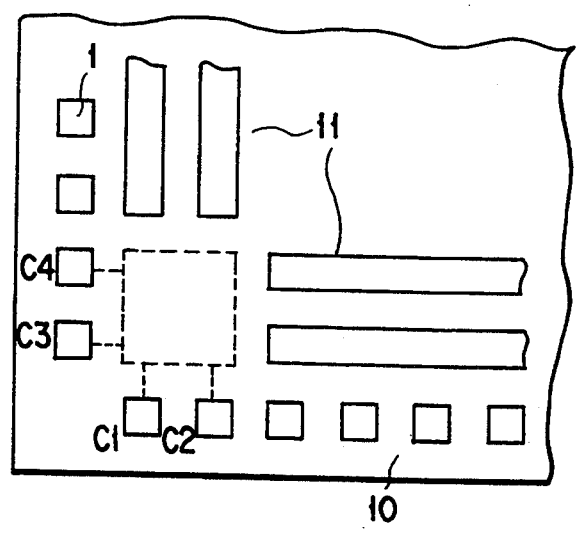
F I G. 19
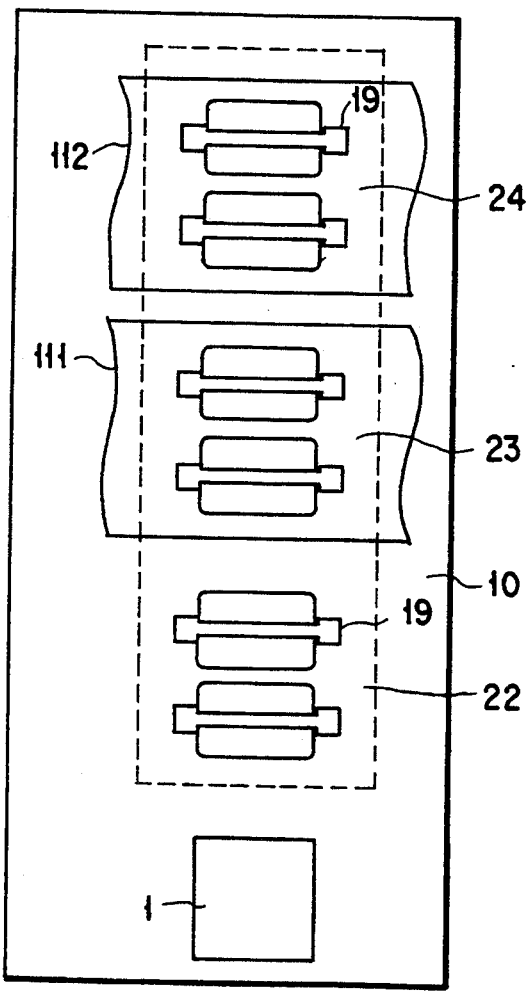
F I G. 20

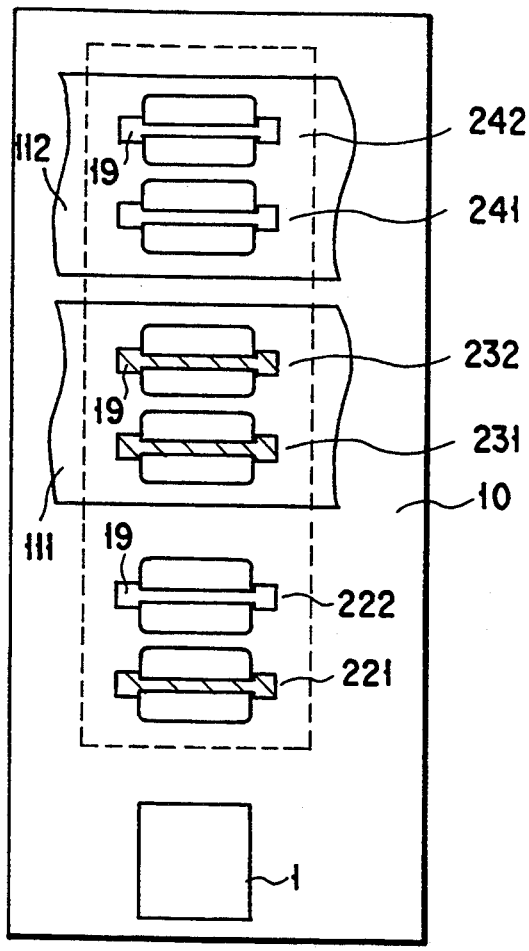
F I G. 21
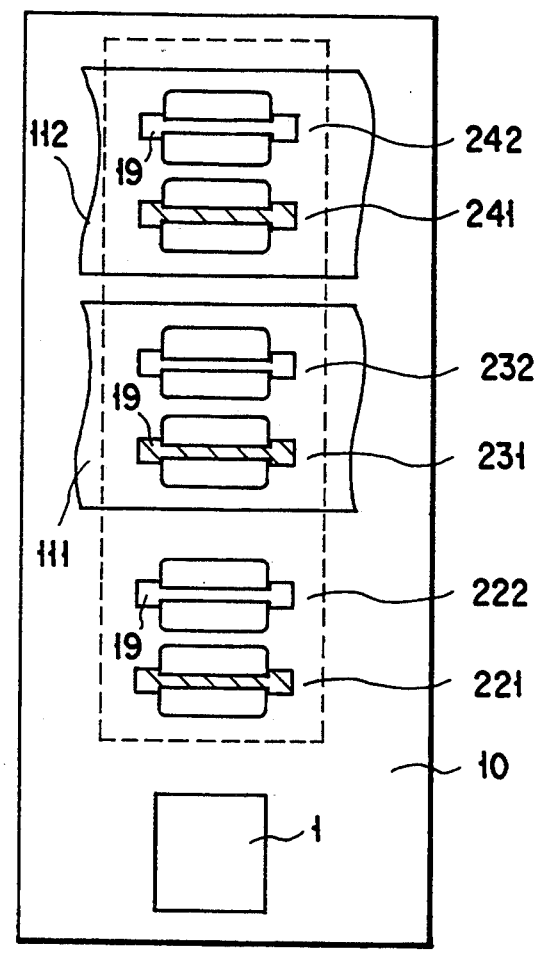
F I G. 22

SEMICONDUCTOR INPUT/OUTPUT CIRCUITS OPERATING AT DIFFERENT POWER SUPPLY VOLTAGES

BACKGROUND OF THE INVENTION

1. Field of the Invention

The present invention relates to a semiconductor integrated circuit device including an input/output circuit having a complementary metal oxide semiconductor (CMOS) structure and, more particularly, to an. input/output circuit that facilitates input/output interfacing with a device that operates at different power supply voltages.

2. Description of the Related Art

The recent advances in the technology of semiconductor integrated circuit devices such as IC and LSI devices greatly depend on element miniaturization represented by scaling. In the old generation of elements having a line width of 1 μm or more, only element dimensions are scaled, whereas the power supply voltage remains at 5 V. In the submicron generation, however, it is becoming difficult to maintain a power supply voltage of 5 V. That is, a decrease in breakdown voltage with a reduction in gate oxide film thickness or a decrease in hot carrier breakdown voltage with a reduction in gate length cannot be neglected. On the other hand, an increase in current consumption with an increase in the number of elements per chip conflicts with the demand for lower power consumption required by portable devices. As described above, from the point of view of elements and users, demands have arisen for lower power supply voltages. In reality, however, the shift of a power supply voltage to 3 V is not smoothly made. This is because if all the ICs of a given system are to be designed to operate at 3 V, some ICs, represented by analog ICs, are not suitable for a reduction in power supply voltage. For this reason, a system including both 3-V and 5-V circuits is inevitably required besides an "all 3-V" system. The present invention is related to interfacing between integrated circuits using different power supply voltages. More specifically, the present invention is applied to integrated circuit devices, such as a microcomputer, a memory, a general-purpose logic, and an ASICLSI, which demand a reduction in power supply voltage.

FIG. 1 shows an input/output circuit normally used for a semiconductor integrated circuit device. In general, an input/output circuit of an integrated circuit (LSI) having a CMOS structure is constituted by a CMOS circuit as in the case of an internal circuit element of the integrated circuit. The input/output circuit includes an output buffer 2 and an input buffer 3, both of which are connected to an input/output terminal 1. The input/output terminal 1 is called a pad on the semiconductor substrate. Such pads are formed on a peripheral portion of the semiconductor substrate. A protective circuit against an externally caused electrostatic discharge is connected between these buffers and the input/output terminal 1. This protective circuit includes a resistor R1 and a diode D1. The output buffer 2 is constituted by an n-channel MOSFET (to be referred to as an NMOS transistor hereinafter) Q1 and a p-channel MOSFET (to be referred to as a PMOS transistor hereinafter) Q2. The input buffer 3 is constituted by an NMOS transistor Q3 and a PMOS transistor Q4. Signals are applied from the transistors Q3 and Q4 to the LSI. Signals A and B from the LSI are respectively applied to the PMOS and NMOS transistor Q2 and Q1 of the output buffer 2. The input/output states of the input/output circuit are shown in the following Table 1:

TABLE 1

| A | B | Q1 | Q2 | Input/Output State |
|---|---|---|---|---|
| L | L | off | on | H-level output state |
| H | H | on | ff | L-level output state |
| H | L | off | off | high-impedance input state |

The input/output circuit operates in the following three input/output states. When both the signals A and B are at L level (Low Level), the NMOS transistor Q1 is turned off, and the PMOS transistor Q2 is turned on. As a result, the input/output state of the input/output circuit becomes an H (High)-level output state. When both the signals A and B are at H level (High Level), the transistor Q1 is turned on, and the transistor Q2 is turned off. As a result, the input/output state becomes an L (Low)-level output state. When the signals A and B are at H level and L level, respectively, both the transistors Q1 and Q2 are turned off, the input/output state becomes a high-impedance input state.

The input/output circuit constituted by such a CMOS circuit is widely used for semiconductor integrated circuit devices. However, a voltage lower than a ground potential of 0 V or higher than a power supply voltage Vcc cannot be applied to the input/output terminal 1. If, for example, a voltage exceeding the voltage Vcc is applied to the input/output terminal 1, the p-n junction formed in the drain area of the PMOS transistor Q2 is biased in the forward direction. As a result, a large current flows from the input/output terminal 1 to a power supply Vcc. For this reason, the rated voltage applied to the input/output terminal 1 is generally limited within the range of ground voltage of 0 V+0.5 V (inclusive) to power supply voltage Vcc+0.5 V (inclusive).

However, with the advances in the miniaturization of an integrated circuit having a CMOS structure and an increase in integration degree, it is becoming difficult to conform to such limitations. For a CMOS-LSI using MOS transistors having a gate length of 0.5 μm or less, it is proposed that the power supply voltage, i.e., 5 V, which has been conventionally used, be decreased to nearly 3 V, in order to prevent a deterioration in element reliability due to an increase in the strength of an electric field in an internal element. In addition, a decrease in power supply voltage, i.e., a decrease in signal amplitude, is preferable in terms of prevention of noise in input/output switching of an integrated circuit. CMOS circuits are not used alone in an integrated circuit but are connected to other CMOS-LSIs having various functions to constitute a system. However, it is not assumed that all these CMOS-LSIs operate at a low power supply voltage, and a plurality of integrated circuits having power supply voltages of 3 V and 5 V may constitute a system. Therefore, a voltage of 5 V may be applied, as an H-level input, to an input/output circuit of an integrated circuit having a power supply voltage of 3 V. In this case, as described above, since a forward bias to the p-n junction is generated, a conventional input/output circuit cannot be used directly. This forward p-n junction current may destroy an element.

Conventional master slice type semiconductor integrated circuit devices formed on p-type silicon semiconductor substrates will be described below with reference to FIGS. 2 to 8. FIG. 2 is a plan view of a p-type silicon semiconductor substrate 10. FIG. 3 is an enlarged plan view of a region R in FIG. 2. The region R includes two regions R1 and R2, each having one output buffer formed therein. An n-well 11 used for an input/output circuit is formed on a peripheral portion of the semiconductor substrate 10. This n-well 11 is formed along the respective sides of the substrate 10 to have an annular shape. A plurality of input/output terminals (pads) 1 are formed in a line between the n-well 11 and each side so as to allow a main logic circuit formed in the semiconductor substrate 10 to be electrically connected to an external circuit through the input/output circuit. The semiconductor substrate 10 is connected to the ground potential. Each gate 19 is made of polysilicon. The entire n-well 11 formed on the p-type semiconductor substrate 10 is connected to the same potential (e.g., 5 V). For this reason, external signals corresponding to a plurality of voltage levels are interfaced by using an A1 wiring pattern 12 as an overlying layer as needed. Furthermore, in such a case, only the potential of the source of a PMOS transistor in the n-well 11 is changed. FIG. 3 is a schematic view of a conventional input/output circuit pattern for obtaining two types of outputs, i.e., a 5-V level output Z1 and a 3-V level output Z2, when the n-well 11 is biased at 5 V. FIG. 4 is a circuit diagram of a 3-V level output buffer 2 for this circuit.

At this time, the source of a PMOS transistor P12 is biased at 3 V to obtain a 3-V level output. When an input A2 for a 3-V level output changes to L level (0 V), the PMOS transistor P12 is turned on. As a result, a potential of 3 V is obtained at the output Z2. In this case, however, since the PMOS transistor P12 is formed in the n-well 11 together with another PMOS transistor P11, a back gate voltage of 5 V is commonly applied to the two transistors, resulting in a deterioration in transistor characteristics, e.g., a decrease in speed.

In an integrated circuit incorporating input protection diodes D2 and D3 shown in FIG. 8 since the cathode side of the protection diode D2 is common to an n-well, if the integrated circuit operates at 3 V, a current flows in the circuit through the protection diode D2 on the positive side upon application of a 5 V level input signal. Therefore, such a circuit cannot be used for a system designed to suppress power consumption. In the above-described prior art, since transistors having different voltage levels are formed in one well region, the output voltage level can be changed only by changing the source voltage, resulting in a decrease in speed. In order to prevent such a deterioration in the transistor characteristics of an input/output circuit, the master slice type semiconductor integrated circuit device shown in FIG. 5 has been proposed.

In this device, independent n-wells are formed along the respective sides. A change in potential is performed by two n-wells 113 formed along adjacent sides and connected to a potential of 5 V, and two n-wells 114 formed along adjacent sides and connected to a potential of 3 V. A decrease in speed due to a back gate effect is prevented in such a manner that the n-wells for interfacing circuits at 5 V are biased at 5 V, and the n-wells for interfacing the circuits at 3 V are biased at 3 V. Since a plurality of input/output circuits as units are formed in one n-well region, a pitch d of the pads 1 is decreased, as shown in FIG. 6. FIG. 6 is a plan view showing a portion of an input/output circuit region of the semiconductor integrated circuit device. As is apparent from FIG. 6, however, in this structure, the formation regions of 5-V and 3-V input/output circuits are limited to the respective sides. That input/output circuits cannot be freely arranged is a critical disadvantage to a master slice type semiconductor integrated circuit device. Therefore, as shown in FIG. 7, it is proposed that n-wells be formed in units of input/output circuits. FIG. 7 is a plan view showing a region, of another conventional master slice type semiconductor integrated circuit device, which corresponds to the portion shown in FIG. 5. With this structure, signals having a plurality of levels can be interfaced by biasing special n-wells at the respective interfacing levels.

In this structure, however, since the input/output circuit formation regions must be formed at predetermined intervals, a pad pitch D shown in FIG. 7 is inevitably larger than the pad pitch d shown in FIG. 6. Consequently, the number of pins is greatly decreased, while the chip size is increased. As described above, if the conventional master slice type integrated circuits are used for a system including integrated circuits having a plurality of voltage levels, it is difficult to perform interfacing with satisfactory characteristics.

SUMMARY OF THE INVENTION

The present invention has been made in the above-described situation, and has as its object to prevent a voltage exceeding the power supply voltage of the output buffer of an input/output circuit from being applied thereto in an integrated circuit using different power supply voltages.

The present invention is characterized in that a plurality of MOSFETs having different potential levels, which constitute an output buffer, are formed on a semiconductor substrate in advance. More specifically, according to the present invention, there is provided a semiconductor integrated circuit device characterized by comprising a semiconductor substrate, a plurality of input/output terminals formed on a peripheral portion of the semiconductor substrate, a main logic circuit portion formed on the semiconductor substrate, a plurality of well regions of a conductivity type different from that of the semiconductor substrate, formed between the input/output terminals and the main logic circuit portion and extending along each side of the semiconductor substrate, at least one of the well regions being biased at a potential different from that of the semiconductor substrate, an input/output circuit having at least one MOSFET formed in the well region, and the MOSFET having one terminal connected to the input/output terminal, and the other terminal connected to the main logic circuit portion, and having a CMOS structure. Each of the well regions is of an n type when the semiconductor substrate is a p-type semiconductor, and is of a p type when the semiconductor substrate is an n-type semiconductor. The plurality of well regions can be separately formed along each side of the semiconductor substrate, and the separate portions are respectively biased at predetermined potentials. Another peripheral circuit can be formed on a corner defined by adjacent sides of the semiconductor substrate, and input/output terminals of this peripheral circuit can be formed on an edge portion, of the semiconductor substrate, which opposes the peripheral circuit.

The well region along each side of the semiconductor substrate is joined to the well region formed along each adjacent side to form an annular region extending along the peripheral portion of the semiconductor substrate, and a plurality of annular well regions similar to the annular region can be formed. A plurality of MOSFETs are formed on the semiconductor substrate and in the well regions. At least one of the MOSFETs formed on the semiconductor substrate or in the well regions can have a structure different from that of the remaining MOSFETs. At least one of the MOSFETs formed on the semiconductor substrate or in the well regions can have a gate oxide film whose film thickness is different from that of gate oxide films of the remaining MOSFETs.

Since a plurality of well regions having different potential levels are formed, an external voltage is applied to the transistor which constitutes the input/output buffer on the semiconductor substrate and has a power supply voltage and a well potential level corresponding to the voltage level of the external voltage, a high back gate voltage is not applied to the buffer, preventing a decrease in speed.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 13 is a plan view of the semiconductor integrated circuit device according to the second embodiment;

FIG. 14 is a plan view of a semiconductor integrated circuit device according to the third embodiment;

FIG. 19 is a plan view of a corner portion of a semiconductor substrate according to the present invention;

FIG. 20 is a plan view showing the arrangement of transistors according to the present invention;

FIG. 21 is a plan view showing the arrangement of transistors according to the present invention; and FIG. 22 is a plan view showing the arrangement of transistor according to the present invention.

DETAILED DESCRIPTION OF THE PREFERRED EMBODIMENTS

The first embodiment of the present invention will be described next with reference to the accompanying drawings.

Figure 1:
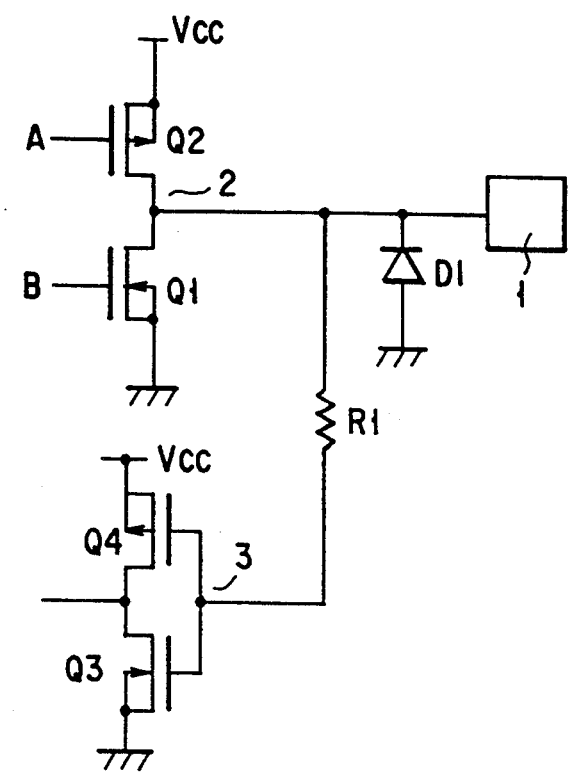
FIG. 1 is a circuit diagram showing an input/output circuit for a conventional semiconductor integrated circuit device.
Figure 2:
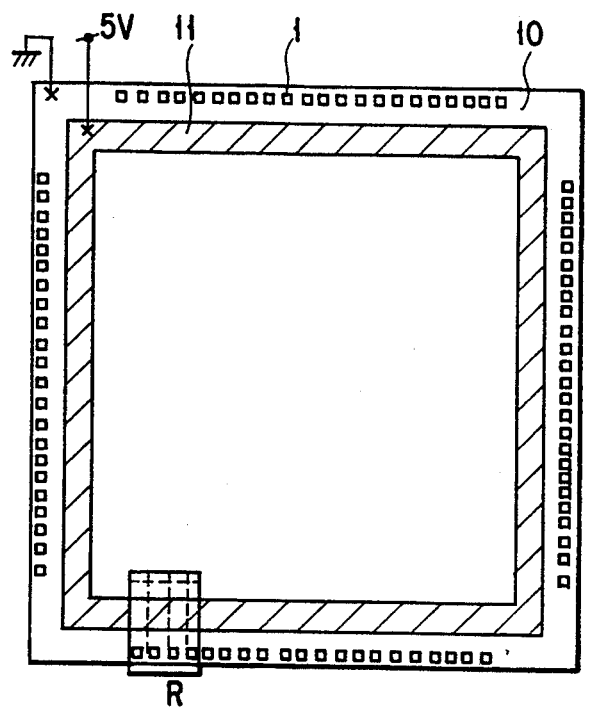
FIG. 2 is a plan view of a conventional semiconductor integrated circuit device.
Figure 3:
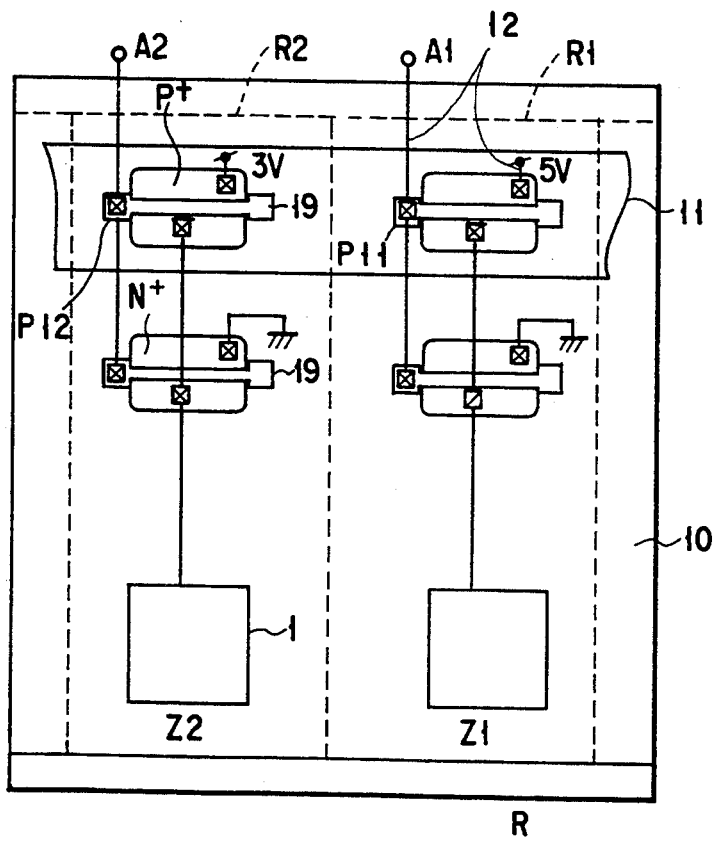
FIG. 3 is a plan view of an output buffer portion in FIG. 2.
Figure 4:
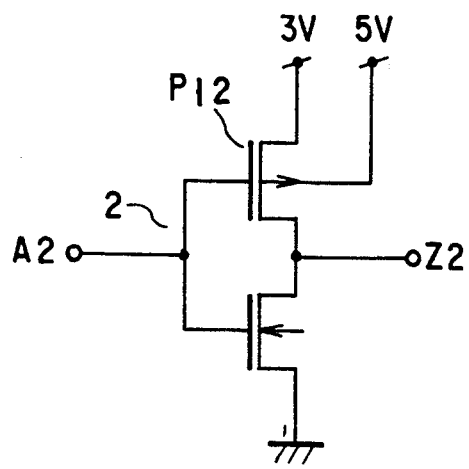
FIG. 4 is an equivalent circuit diagram of FIG. 3.
Figure 5:
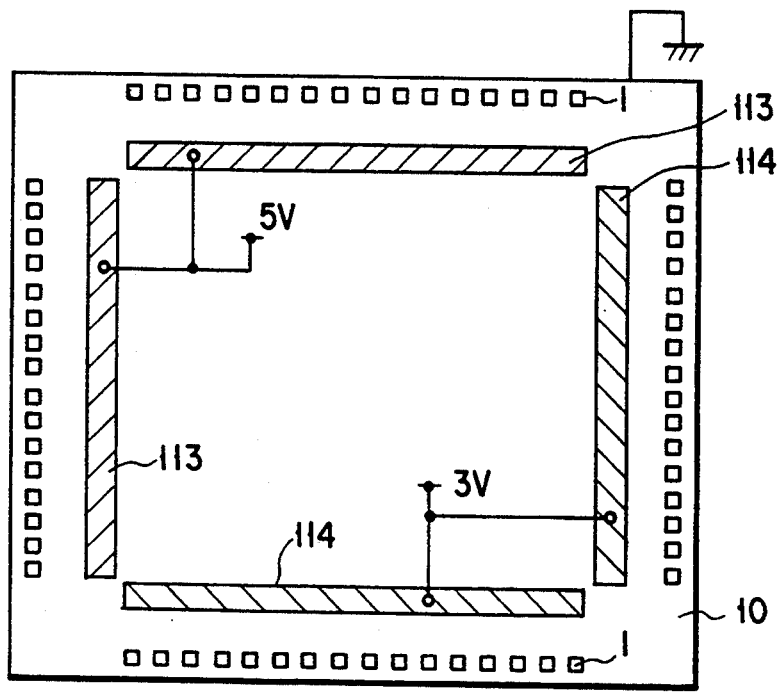
FIG. 5 is a plan view of a conventional semiconductor integrated circuit device.
Figure 6:
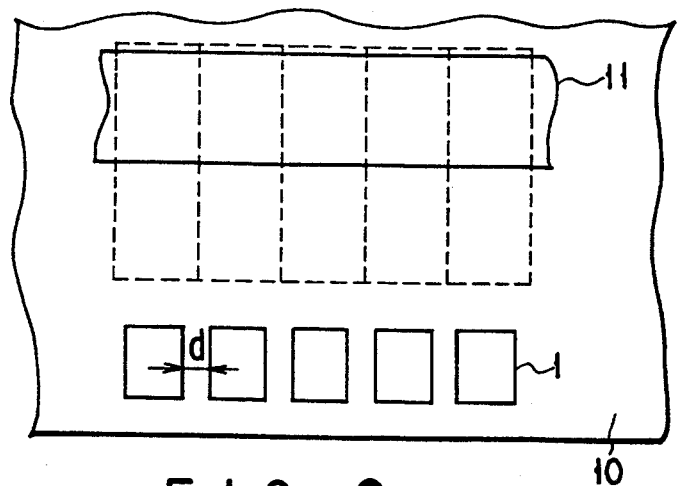
FIG. 6 is a plan view of a portion of the device in FIG. 5.
Figure 7:
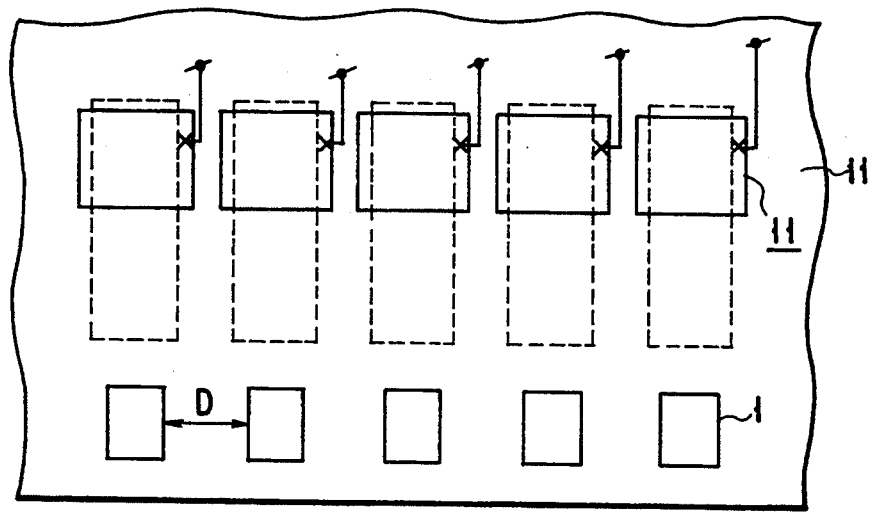
FIG. 7 is a plan view of a portion of a conventional semiconductor integrated circuit device.
Figure 8:
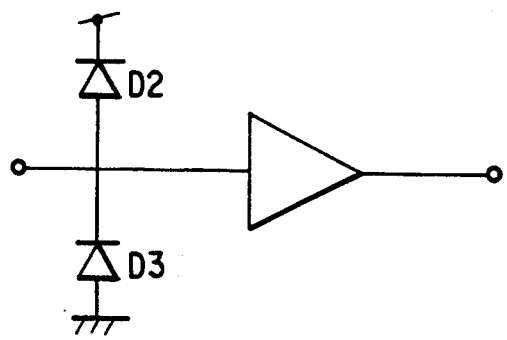
FIG. 8 is a circuit diagram of a conventional input buffer with input protection diodes.
Figure 9:
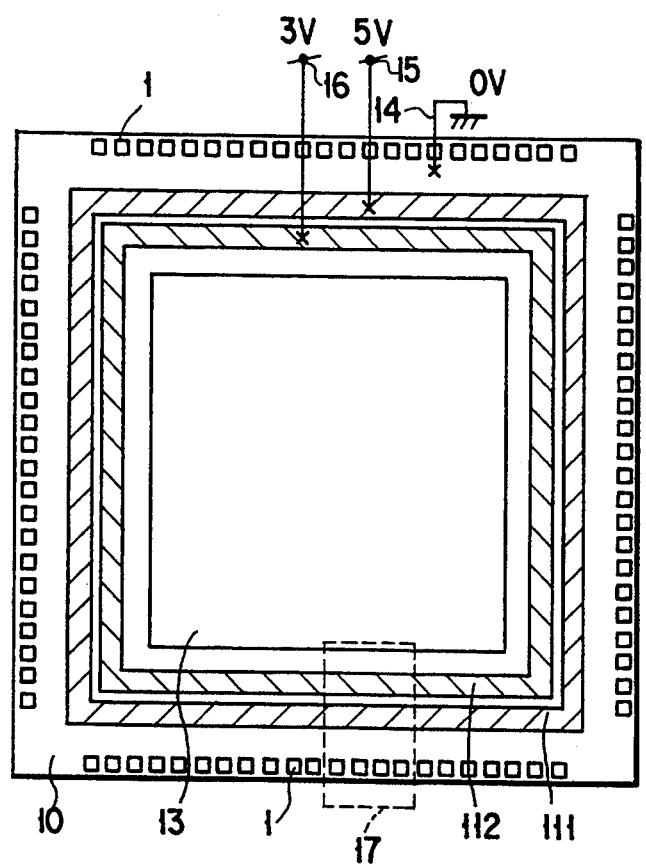
FIG. 9 is a plan view of the semiconductor integrated circuit device according to the first embodiment.

FIG. 9 is a plan view showing a semiconductor substrate on which a master slice type semiconductor integrated circuit device according to the present invention is formed. In this embodiment, a main logic circuit portion 13 including gate arrays, cells, and the like, being capable of interfacing two different voltage levels, i.e., an amplitude from 0 V to 5 V and an amplitude from 0 V to 3 V, is formed on a p-type silicon semiconductor substrate 10. The main logic circuit portion 13 including the gate array and the like is formed on a central portion of the semiconductor substrate 10, and input/output terminals, i.e., pads 1, are formed within a peripheral portion of the substrate 10, along its sides. In addition, independent n-wells 111 and 112 are formed around the main logic circuit portion 13 on the substrate central portion so as to form a double ring structure, and part of an input/output circuit is formed therein. In this manner, an NMOS transistor formation region of the input/output circuit is formed inside the peripheral region in which the pads 1 are formed, and the n-well 111 is formed, as a PMOS transistor formation region, inside the NMOS transistor formation region in the form of a ring; Similarly, inside the n-well 111, the n-well 112 is formed, as a PMOS transistor formation region, independently of the n-well 111, so as to extend therealong in the form of a ring.

Figure 10:
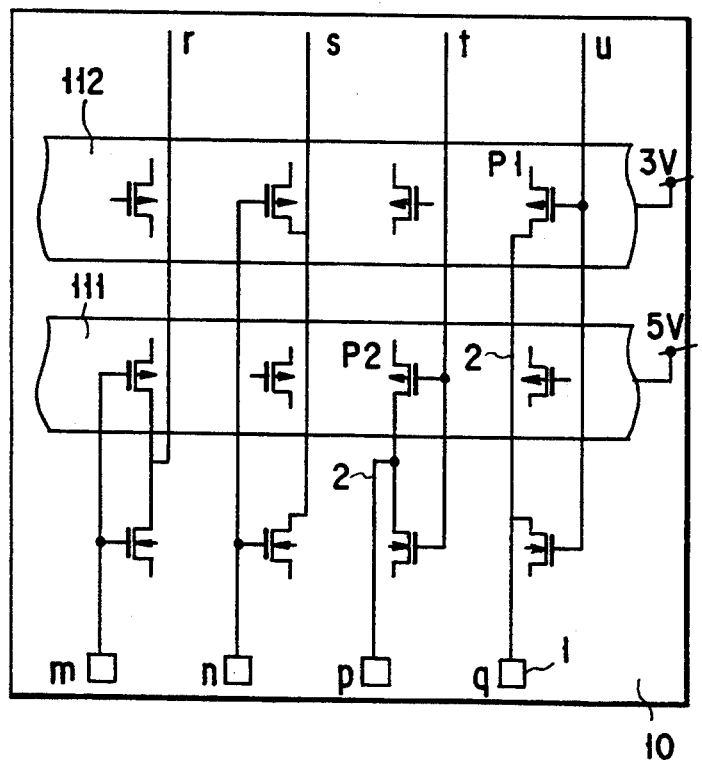
FIG. 10 is a schematic circuit diagram of an input/output circuit portion of the semiconductor integrated circuit device in FIG. 9.

The semiconductor substrate 10, the n-well 111, and the n-well 112 are biased at the GND (0 V) potential, 5 V, and 3 V, respectively, through terminals 14, 15, and 16. FIG. 10 is a schematic plan view of the input/output circuit having such a well structure, which is an enlarged view of a region 17 enclosed with the broken line in FIG. 9. In order to obtain an output signal having an amplitude from 0 V to 5 V, for example, it uses a buffer having a PMOS transistor with a source voltage of 5 V formed in the n-well 111 biased at 5 V, such as an output buffer structure 2 between an internal terminal t and an output pad p. with such an arrangement, a high-speed buffer to which no back gate voltage is applied can be formed. In order to obtain an output signal having an amplitude from 0 V to 3 V, for example, it uses a buffer having a PMOS transistor formed in the n-well 112 biased at 3 V, such as an output buffer structure 2 between an internal terminal u and an output pad q. Since the n-wells are independently formed in advance, input protective diodes and the like may be formed in the respective n-wells in accordance with input signals, thus greatly facilitating the design.

Figure 11:
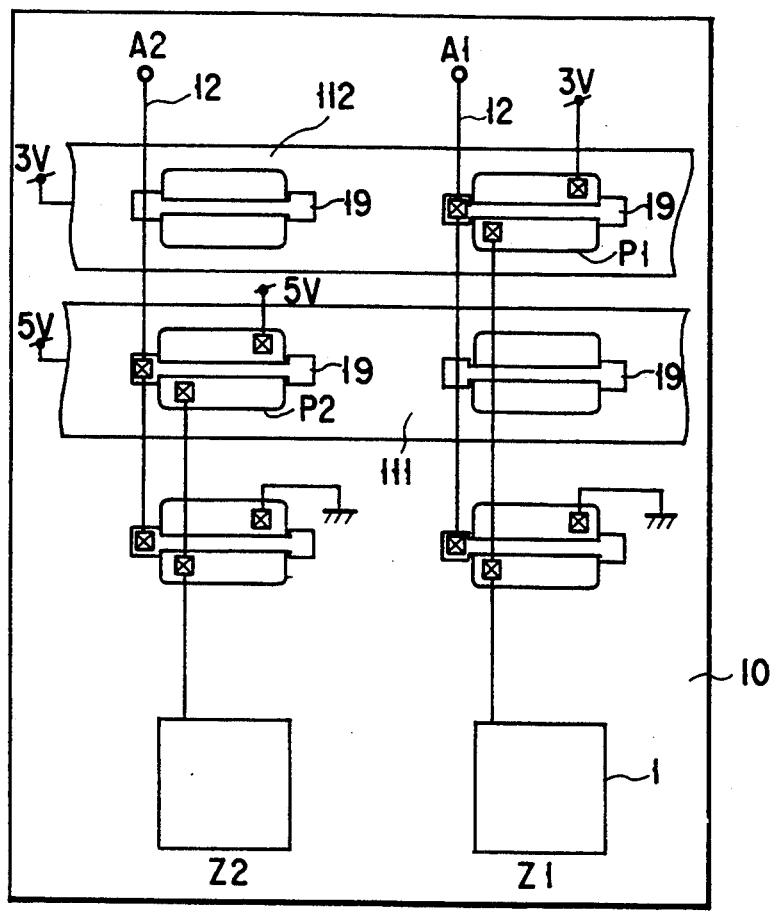
FIG. 11 is a plan view of an output buffer portion of a semiconductor substrate in FIG. 9.
Figure 12:
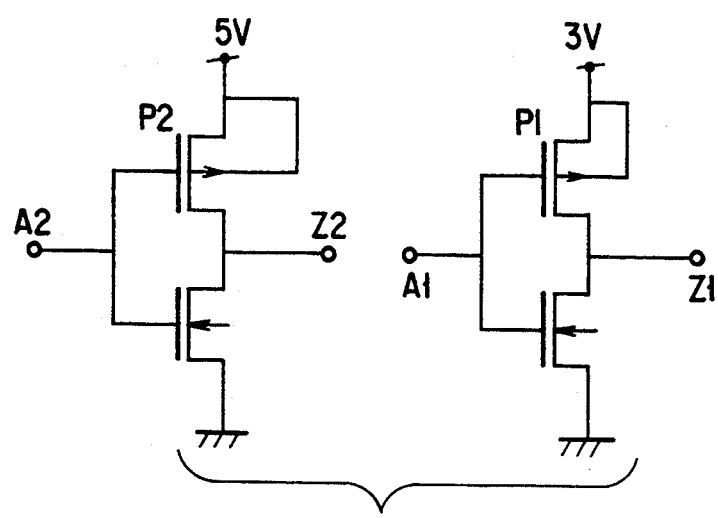
FIG. 12 is an equivalent circuit diagram of FIG. 11.

FIG. 11 is an enlarged plan view showing a portion of the region 17, of the semiconductor substrate 10 shown in FIG. 9, which is enclosed with the broken line, specifically a portion, of the semiconductor substrate, on which two buffers are formed. Each buffer is formed by connecting an A1 wire 12 to the gate, source, drain regions, and the like, of elements formed in the semiconductor substrate. For example, input terminal A1 and A2 respectively correspond to the internal terminals u and t in FIG. 10, and output terminals Z1 and Z2 respectively correspond to the pads q and p in FIG. 10. FIG. 12 is an equivalent circuit diagram of the output buffers 2. As the PMOS transistor of the output buffer on the left side in FIG. 12, a transistor P2 formed on the n-well 111 having a potential of 5 V. As the PMOS transistor of the output buffer on the right side in FIG. 12, a transistor P1 formed on the n-well 112 having a potential of 3 V is used. With this arrangement, as shown in FIG. 12, no back gate voltage is applied to the buffers. In this embodiment, since each well continuously extends along the respective sides of the substrate to have an annular shape, a potential can be extracted at any position by connecting a power supply to at least one portion of the well. Each of gates 19 shown in FIG. 11 consists of polysilicon.

The second embodiment of the present invention will be described below with reference to FIG. 13. Referring to FIG. 13, n-well regions are formed in a substrate as in the embodiment described above. Similar to the embodiment shown in FIG. 9, independent n-wells 113, 114, and 115 are formed along pads on a peripheral portion of the substrate so as to form a double ring structure surrounding a substrate central portion. In this case, two n-wells are independently formed on each side of a p-type silicon substrate 10, and interfacing of the respective sides can be performed at different voltage levels. This structure is effective for interfacing at a larger number of voltage levels. Of the well regions on the upper and right sides, the n-wells 113 located outside have a potential level of 5 V, and the n-wells 114 located inside have a potential level of 3 V. Of the well regions on the left and lower sides, the n-wells 114 located outside have a potential level of 3 V, and the n-wells 115 located inside have a potential level of 2 V. If the well regions are isolated for every side in this manner, each well can be set at an arbitrary potential level. In the above-described case, the n-well regions 113–115 are formed into a double ring structure. However, the number of rings constituting a multiple ring structure may be increased to three or more in order to obtain buffers having a large number of voltage levels.

The third embodiment using an n-type silicon semiconductor substrate will be described below with reference to FIG. 14. A p-well region 21 having a double ring structure is formed between the region of pads 1 on a peripheral portion of a semiconductor substrate 20 and a main logic circuit portion on a central portion of the substrate. In this embodiment, a main logic circuit portion 13 including gate arrays, cells, and the like, being capable of interfacing two different voltage levels, i.e., an amplitude from 0 V to −5 V and an amplitude from 0 V to −3 V, is formed on a n-type silicon semiconductor substrate 10. On the semiconductor substrate 20, independent p-wells 211 and 212 are formed between the main logic circuit portion 13 and the pads 1 are formed along each side, and part of an input/output circuit is formed in the p-wells. In this manner, a PMOS transistor formation region of the input/output circuit is formed inside the peripheral region where the pads 1 are formed, and the p-well 211 is formed, as a NMOS transistor formation region, inside the PMOS transistor formation region in the form of a ring. Similarly, inside the p-well 211, the p-well 212 is formed, as an NMOS transistor formation region, independently of the p-well 211, so as to extend therealong in the form of a ring.

The semiconductor substrate 20, the p-well 211, and the p-well 212 are biased at the GND (0 V) potential, −5 V, and −3 V, respectively. The function and effect obtained by such an arrangement are the same as those obtained by the master slice type semiconductor integrated circuit device shown in FIG. 9. Even with this n-type semiconductor substrate, a buffer with a large number of voltage levels can be obtained by increasing the number of well regions constituting a multiple ring structure to three or more. In addition, by forming independent p-wells on each side of a semiconductor substrate, interfacing of the respective sides can be performed at different voltage levels.

Figure 15:
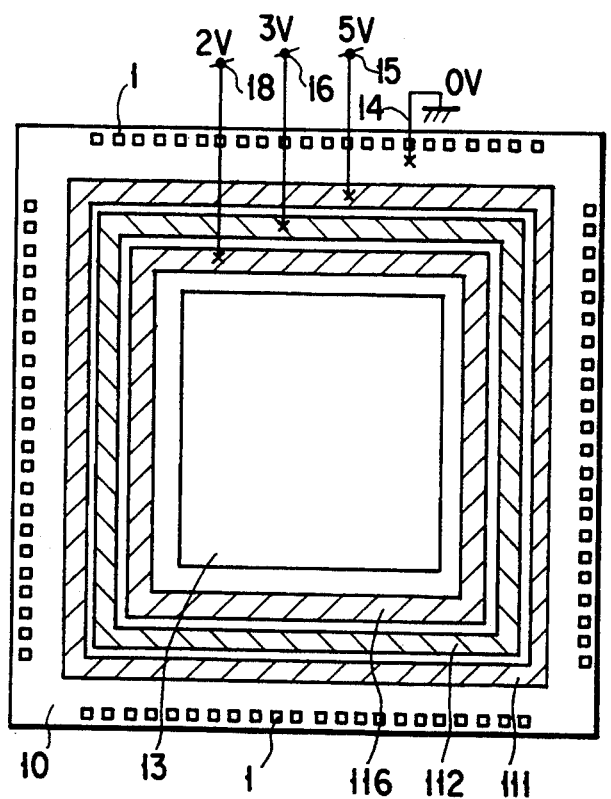
FIG. 15 is a plan view of a semiconductor integrated circuit device according to the fourth embodiment.

The fourth embodiment of the present invention will be described next with reference to FIG. 15. FIG. 15 is a plan view showing a semiconductor substrate on which a master slice type semiconductor integrated circuit device is formed. Since each well region formed along the respective sides of this semiconductor substrate has a continuous annular shape, at least one portion of each well may be connected to a power supply voltage. This structure is effective in increasing the integration density of a semiconductor integrated circuit device. A characteristic feature of this embodiment is that annular n-wells are formed into a triple ring structure. A main logic circuit portion 13 including gate arrays, cells, and the like, being capable of interfacing three types of voltage levels, i.e., an amplitude from 0 V to 5 V, an amplitude from 0 V to 3 V, and an amplitude from 0 V to 2 V, is formed on a p-type silicon semiconductor substrate 10. On the semiconductor substrate 10, the main logic circuit portion 13 is formed on a central portion, and input/output terminals, i.e., pads 1, are formed on a peripheral portion, along the respective side. In addition, independent annular n-wells 111, 112, and 116 are formed, in this order from the outside, between the main logic circuit portion 13 and the pads 1. The formation region of an NMOS transistor of an input/output circuit is formed in a region between the aligned pads 1 and the outermost annular n-well 111. This transistor constitutes the input/output circuit together with a PMOS transistor in the n-well region. The semiconductor substrate 10, the n-well 111, the n-well 112, and the n-well 116 are biased at the GND (0 V) potential, 5 V, 3 V, and 2 V, respectively, through a terminal 14, a terminal 15, a terminal 16, and a terminal 18. In this manner, the respective wells can be set at arbitrary potential levels.

Figure 16:
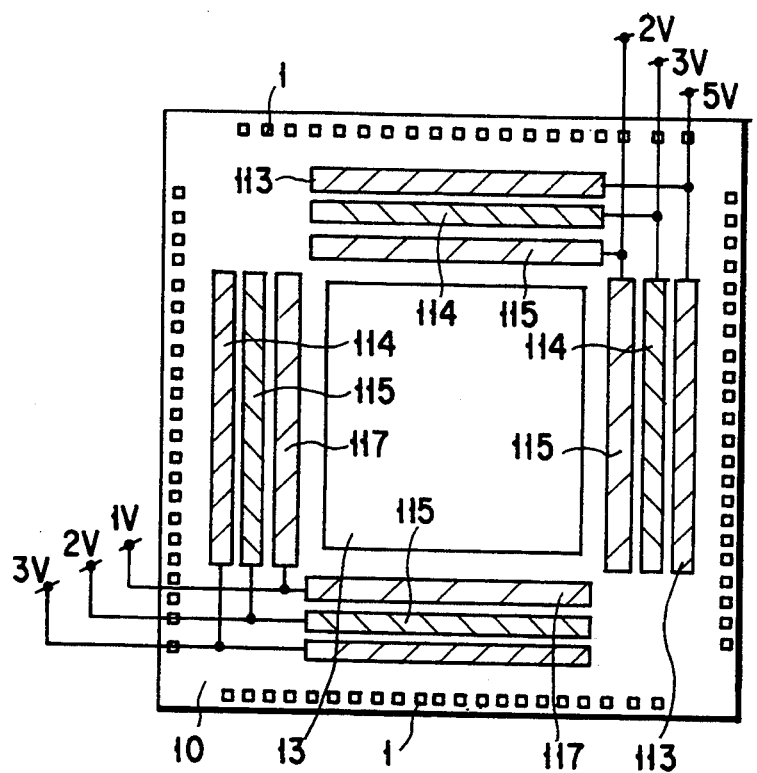
FIG. 16 is a plan view of a semiconductor integrated circuit device according to the fifth embodiment.

The fifth embodiment of the present invention will be described next with reference to FIG. 16. FIG. 16 is a plan view showing a semiconductor substrate on which a master slice type semiconductor integrated circuit device is formed. Similar to the structure shown in FIG. 13, well regions along each side of the semiconductor substrate are independently formed to allow interfacing at different potential levels on the respective sides. Wells having the same potential level are connected to each other through wires. Of the well regions formed along the upper and right sides, an outermost n-well 113, an intermediate n-well 114, and an innermost n- well 115 respectively have potential levels of 5 V, 3 V, and 2 V. Of the well regions formed along the left and lower sides, an outermost n-well 114, an intermediate n-well 115, and an innermost n-well 117 respectively have potential levels of 3 V, 2 V, and 1 V. If the well regions formed along the respective sides are isolated from each other in this manner, each well can be set at an arbitrary potential level.

Figure 17:
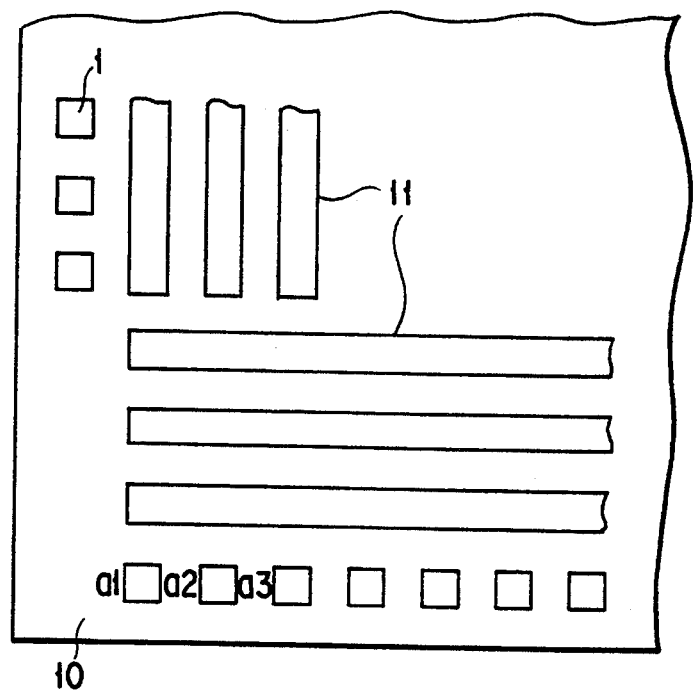
FIG. 17 is a plan view of a corner portion of a semiconductor substrate according to the present invention.
Figure 18:
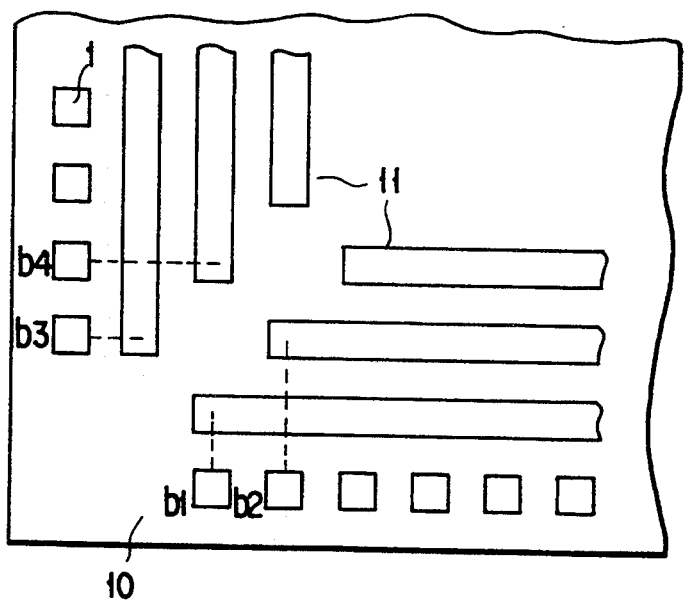
FIG. 18 is a plan view of a corner portion of a semiconductor substrate according to the present invention.

The use of the corner portions of a semiconductor substrate according to the present invention will be described below with reference to FIGS. 17 to 19, each of which is a plan view of a corner of the semiconductor substrate. In the related art, the corners of semiconductor substrates are often treated as dead spaces. If, however, well regions are independently formed along each side, as shown in FIGS. 13 and 16, such corners can be effectively used. When a well region 11 formed along the lower side is extended as close to a corner portion as possible, as shown in FIG. 17, the number of pads 1 formed along the lower side is increased. Since pads a1, a2, and a3 can be connected to transistors in any wells, they can be used as input/output circuit terminals corresponding to arbitrary potential levels. The same effect can be obtained even by extending the wells formed along the left side. FIG. 18 shows a state wherein the wells formed along the left and lower sides are extended to a corner portion to be close to each other. In this structure, since the length by which each well is extended into the corner portion differs depending on its position, pads b1 and b3 on the outermost portions of the respective sides correspond to only outermost n-wells 114. Therefore, potential levels cannot be selected arbitrarily by using these terminals. Second pads b2 and b4 with respect to the outermost portions correspond to only two types of wells. As described above, in the arrangement shown in FIG. 18, the selection of potential levels is limited by the positions of pads. FIG. 19 shows a case wherein pads on a corner portion are not used as input/output circuit terminals. Instead, a peripheral circuit 19, e.g., a transmission circuit or an analog circuit, of an integrated circuit is efficiently arranged in the space of the corner portion. Consequently, pads c1, c2, c3, and c4 on the corner portion are used as the input/output terminals of this peripheral circuit.

The structures of transistors according to the present invention will be described below with reference to FIGS. 20 to 22, each of which is a sectional view showing a portion of an input/output circuit region including a pad 1 of a semiconductor substrate 10. On the semiconductor substrate 10, a plurality of NMOS transistors 22 to be selected to constitute an input/output circuit are formed. Each gate 19 consists of polysilicon. In addition, a plurality of PMOS transistors 23 and 24 to be selected to constitute the input/output circuit are formed in n-wells 111 and 112. A dozen or so transistors are formed in each region. FIG. 20 shows an arrangement in which transistors having the same structure are used as NMOS and PMOS transistors. For example, only 5-V process transistors are used. In this case, since a 5-V process transistor is used even for a 3-V level output buffer, the transistor cannot exhibit its full performance. As a result, the signal speed may be slightly decreased.

Referring to FIG. 21, for example, a 5-V process PMOS transistor 242 is formed in an n-well 112, and a 3-V process PMOS transistor 231 is formed in an n-well 111. Two types of NMOS transistors 221 and 222 having different structures are formed on a semiconductor substrate 10. Since different types of transistors are formed in the respective wells in this manner, a 3-V process transistor can be used for a 3-V level output buffer, for example, thereby improving the transistor characteristics, e.g., preventing a decrease in speed. A 3-V process transistor differs from a 5-V process transistor in terms of a process. For example, the gate oxide film of the former is thinner than that of the latter. However, since transistor characteristics may be changed in units of wells, the difficulty in manufacturing such transistors is relatively small. Referring to FIG. 21, the transistors 221 and 231 having the gates 19 indicated by hatching are transistors which have thin gate oxide films.

FIG. 22 shows an arrangement in which a plurality of transistors having different structures are formed in each region (111 and 112) and a semiconductor substrate 10. For example, a 3-V process PMOS transistor 231 and a 5-V process PMOS transistor 232 are formed in an n-well 111. Similarly, a 3-V process PMOS transistor 241 and a 5-V process PMOS transistor 242 are formed in an n-well 112. In the semiconductor substrate 10, a 3-V process NMOS transistor 221 and a 5-v process NMOS transistor 222 are formed. Since different types of transistors are formed on the semiconductor substrate and in each well, a 3-V process transistor can be used for a 3-V level output buffer, for example, thereby improving the transistor characteristics, e.g., preventing a decrease in speed. Since different types of transistors are formed in one well region, the manufacturing process is complicated more than that in the above-described method. However, it is not impossible to form transistors having gate oxide films with different thicknesses in one well. In addition, an optimized transistor suitable for a potential level of an input/output circuit can be more easily selected.

According to the preferred embodiments of the present invention, a voltage exceeding the power supply voltage of a semiconductor integrated circuit device can be applied to an input/output terminal, and signals from integrated circuits which operate at different power supply voltages can be connected to the input/output terminal. More specifically, a CMOSLSI which satisfies the conditions required by Japan Industrial Standard Proposal (JEDEC STANDARD 8-1, 1984) in which signal levels are specified can be realized. That is, a CMOSLSI which operates at a power supply voltage of 3.3 V and allows a maximum voltage of 4.8 V as a signal input can be realized. In addition, according to the first embodiment, since the device operates at 3.3 V in an actual switching operation, a low-noise operation can be realized. Since a high-impedance input state can be automatically detected, no external control signal is required.

Furthermore, the pads 1, the n-well 111 biased at 5 V, and the n-well 112 biased at 3 V are formed around the main logic circuit on the substrate central portion. That is, the n-wells are always arranged along the pads. Therefore, an input/output buffer can be easily formed by using any one of the pads as an input/output terminal without influencing the adjacent pads, regardless of whether the buffer is for 3 V or 5 V. This realizes a terminal arrangement free from limitations based on the voltage level difference between 3-V and 5-V level buffers. As a result, a master slice type semiconductor integrated circuit device which is free from terminal arrangement limitations based on voltage level differences can be realized.

The present invention can be applied to not only a silicon semiconductor but also other existing semiconductors such as GaAs.

With the above-described arrangement, according to the present invention, there is provided a master slice type semiconductor integrated circuit device which allows a free input/output circuit arrangement free from limitations on an input/output terminal arrangement, and interfacing a plurality of voltage levels without causing a decrease in speed.

Additional advantages and modifications will readily occur to those skilled in the art. Therefore, the invention in its broader aspects is not limited to the specific details, and representative devices shown and described herein. Accordingly, various modifications may be made without departing from the spirit or scope of the general inventive concept as defined by the appended claims and their equivalents.

What is claimed is:

1. A semiconductor integrated circuit device comprising:
   a semiconductor substrate;
   a plurality of interface terminals on a peripheral portion of said semiconductor substrate;
   a main logic circuit portion on said semiconductor substrate;
   a plurality of well regions of a conductivity type different from that of said semiconductor substrate, between said interface terminals and said main logic circuit portion, at least one of said well regions being biased at a potential different from that of said semiconductor substrate; and
   a plurality of interface circuits each having a MOSFET in one of said well regions, said MOSFET having a first terminal connected to one of said interface terminals, and a second terminal connected to said main logic circuit portion, and having a CMOS structure,
   wherein along each side of said semiconductor substrate, multiple ones of the plurality of well regions extend in parallel.

2. A device according to claim 1, wherein each of said well regions is of an n-type when said semiconductor substrate is a p-type semiconductor, and is of a p-type when said semiconductor substrate is an n-type semiconductor.

3. A device according to any one of claims 1 and 2, wherein said plurality of well regions are located along each side of said semiconductor substrate, and are respectively biased at predetermined potentials.

4. A device according to claim 3, wherein a peripheral circuit is on a corner defined by adjacent sides of said semiconductor substrate, and interface terminals of said peripheral circuit are on the edge portion, of said semiconductor substrate opposing said peripheral circuit.

5. A device according to any one of claims 1 and 2, wherein said multiple well regions are each joined to a corresponding well region on two other sides of said semiconductor substrate to constitute multiple annular well regions.

6. A device according to any one of claims 1 and 2, wherein a plurality of MOSFETs are on said semiconductor and in said well regions.

7. A device according to claim 6, wherein at least one of said MOSFETs on said semiconductor substrate or in said well regions has a structure different from that of said remaining MOSFETs.

8. A device according to claim 7, wherein at least one of said MOSFETs on said semiconductor substrate or in said well regions has a gate oxide film whose film thickness is different from that of gate oxide films of said remaining MOSFETs.

9. A device according to claim 3, wherein a plurality of MOSFETs are on said semiconductor substrate and in said well regions.

10. A device according to claim 9, wherein at least one of aid MOSFETs on said semiconductor substrate or in said well regions has a structure different from that of said remaining MOSFETs.

11. A device according to claim 10, wherein at least one of said MOSFETs on said semiconductor substrate or in said well regions has a structure different from that of said remaining MOSFETs.

12. A device according to claim 4, wherein a plurality of MOSFETs are on said semiconductor substrate and in said well regions.

13. A device according to claim 12, wherein at least one of said MOSFETs on said semiconductor substrate or in said well regions has a structure different from that of said remaining MOSFETs.

14. A device according to claim 13, wherein at least one of said MOSFETs on said semiconductor substrate or in said well regions has a gate oxide film whose film thickness is different from that of gate oxide films of said remaining MOSFETs.

15. A device according to claim 5, wherein a plurality of MOSFETs are on said semiconductor substrate and in said well regions.

16. A device according to claim 15, wherein at least one of said MOSFETs on said semiconductor substrate or in said well regions has a structure different from that of said remaining MOSFETs.

17. A device according to claim 16, wherein at least one of said MOSFETs on said semiconductor substrate or in said well regions has a gate oxide film whose film thickness is different from that of gate oxide :films of said remaining MOSFETs.

18. A device according to claim 6, further including
   at least 2 independent well regions in an interface circuit area, and
   wherein one of the interface circuits has a first MOSFET in one of the independent well regions, and a second MOSFET coupled to the first MOSFET, outside of the independent well regions.

19. A semiconductor integrated circuit device comprising:
   a semiconductor substrate;
   a plurality of interface terminals on a peripheral portion of said semiconductor substrate;
   a main logic circuit portion on said semiconductor substrate;
   a plurality of well regions of a conductivity type different from that of said semiconductor substrate, between said terminals and said main logic circuit portion, at least one of said well regions being biased at a potential different from that of said semiconductor substrate; and
   a plurality of interface circuits each having a MOSFET in one of said well regions, said MOSFET having a first terminal connected to one of said interface terminals, and a second terminal connected to said main logic circuit portion, and having a CMOS structure,
   wherein said well regions extend along each side of said semiconductor substrate, and said well region along with each side of said semiconductor substrate is joined to said well region formed along each adjacent side to form an annular region extending along the peripheral portion of said semiconductor substrate, and a plurality of annular well regions similar to said annular region are formed.

20. A semiconductor integrated circuit device comprising:

a semiconductor substrate;

a plurality of interface terminals on a peripheral portion of said semiconductor substrate;

a main logic circuit portion on said semiconductor or substrate;

a plurality of well regions of a conductivity type different from that of said semiconductor substrate, between said interface terminals and said main logic circuit portion, at least one of said well regions being biased at a potential different from that of said semiconductor substrate; and a plurality of interface circuits each having a MOSFET in one of said well regions, said MOSFET having a first terminal connected to one of said interface terminals, and a second terminal connected to said main logic circuit portion, and having a CMOS structure, wherein said well regions extend along each side of said semiconductor substrate, each of said well regions is of an n-type when said semiconductor substrate is a p-type semiconductor, and is of a p-type when said semiconductor substrate is an n-type semiconductor, and said well region along with each side of said semiconductor substrate is joined to said well region formed along each adjacent side to form an annular region extending along the peripheral portion of said semiconductor substrate, and a plurality of annular well regions similar to said annular region are formed.

21. A semiconductor integrated circuit device comprising:

a semiconductor substrate;

a plurality of interface terminals on a peripheral portion of said semiconductor substrate;

a main logic circuit portion on said semiconductor substrate;

a plurality of well regions of a conductivity type different from that of said semiconductor substrate, between said interface terminals and said main logic circuit portion, including a first well region between an interface terminal and said main logic circuit portion, and a second well region between the interface terminal and the first well region, at least one of said well regions being biased at a potential different from that of said semiconductor substrate; and plurality of interface circuits each having a MOSFET in one of said well regions, said MOSFET having a first terminal connected to one of said interface terminals, and a second terminal connected to said main logic circuit portion, and having a MOS structure, wherein said well regions extend along each side of said semiconductor substrate.

* * * * *

UNITED STATES PATENT AND TRADEMARK OFFICE
CERTIFICATE OF CORRECTION

PATENT NO. : 5,347,150
DATED : September 13, 1994
INVENTOR(S) : Izumi SAKAI et al.

It is certified that error appears in the above-indentified patent and that said Letters Patent is hereby corrected as shown below:

Claim 10, Column 12, Line 10 change "aid" to --said--.

Claim 17, Column 12, Line 39 change ":films" to --films--.

Claim 18, Column 12, Line 46 before "coupled" insert --,--.

Claim 19, Column 12, Line 57 before "terminals" insert --interface--.

Claim 21, Column 14, Line 28 change "MOS" to --CMOS--.

Signed and Sealed this

Twenty-first Day of March, 1995

Attest:

BRUCE LEHMAN

Attesting Officer    Commissioner of Patents and Trademarks